(12) United States Patent
Ben Mohamed et al.

(10) Patent No.: US 7,485,545 B2
(45) Date of Patent: Feb. 3, 2009

(54) METHOD OF CONFIGURING A PROCESS TO OBTAIN A THIN LAYER WITH A LOW DENSITY OF HOLES

(75) Inventors: Nadia Ben Mohamed, Renage (FR); Eric Neyret, Sassenage (FR); Daniel Delprat, Crolles (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 466 days.

(21) Appl. No.: 11/328,061

(22) Filed: Jan. 10, 2006

(65) Prior Publication Data

US 2006/0141755 A1 Jun. 29, 2006

Related U.S. Application Data

(63) Continuation-in-part of application No. PCT/IB2004/004390, filed on Dec. 28, 2004.

(51) Int. Cl.
*H01L 21/302* (2006.01)
(52) U.S. Cl. ........................... 438/459; 438/464
(58) Field of Classification Search ......... 438/510–532, 438/106–127, 455–465
See application file for complete search history.

(56) References Cited

U.S. PATENT DOCUMENTS

| 5,374,564 | A | 12/1994 | Bruel | 437/24 |
|---|---|---|---|---|
| 6,100,166 | A | 8/2000 | Sakaguchi et al. | 438/455 |
| 6,403,450 | B1 | 6/2002 | Maleville et al. | 438/471 |
| 6,902,988 | B2 * | 6/2005 | Barge et al. | 438/458 |
| 2002/0061660 | A1 | 5/2002 | Ito | 438/795 |
| 2002/0106870 | A1 | 8/2002 | Henley et al. | 438/464 |
| 2004/0115905 | A1 | 6/2004 | Barge et al. | 438/473 |
| 2004/0151483 | A1 | 8/2004 | Neyret et al. | 392/416 |
| 2004/0161948 | A1 | 8/2004 | Maleville et al. | 438/795 |
| 2004/0166650 | A1 | 8/2004 | Yokokawa et al. | 438/455 |
| 2004/0219370 | A1 * | 11/2004 | Aga et al. | 428/446 |
| 2004/0248380 | A1 | 12/2004 | Aulnette et al. | 438/459 |
| 2005/0014346 | A1 | 1/2005 | Mitani et al. | 438/458 |
| 2005/0148163 | A1 | 7/2005 | Nguyen et al. | 438/514 |
| 2007/0287273 | A1 * | 12/2007 | Boussagol et al. | 438/503 |
| 2008/0038564 | A1 * | 2/2008 | Bruel | 428/446 |

FOREIGN PATENT DOCUMENTS

EP 1 193 749 A2 4/2002

(Continued)

OTHER PUBLICATIONS

Celler, G.K. et al., "Frontiers of Silicon-on-Insulator", J. Appl. Phys. vol. 93, No. 9, 2003, pp. 4955-4978.

(Continued)

*Primary Examiner*—Savitri Mulpuri
(74) *Attorney, Agent, or Firm*—Winston & Strawn LLP

(57) ABSTRACT

A method for configuring a process for treating a semiconductor wafer. A minimum layer thickness of a transferred layer to be provided is determined to obtain a processed layer that has a preselected target thickness and target maximum density of through holes that extend completely therethrough, by conducting a predetermined finishing sequence of operations that improve the surface quality of the layer. The minimum thickness is determined such that the density of through holes remains below the target maximum density after each operation in the finishing sequence.

18 Claims, 11 Drawing Sheets

FOREIGN PATENT DOCUMENTS

| | | |
|---|---|---|
| FR | 2 797 713 A1 | 2/2001 |
| WO | WO 03/009366 A1 | 1/2003 |
| WO | WO 2004/079801 | 3/2004 |
| WO | WO 2005/013318 A2 | 2/2005 |
| WO | WO 2005/043615 A1 | 5/2005 |

OTHER PUBLICATIONS

Tong, Q.Y. et al., "Semiconductor Wafer Bonding: Sciences and Technology", Wiley/Interscience technology publications, 1999.

Colinge, Jean-Pierre, Silicon-On-Insulator Technology: Materials to VLSI, 2nd Edition, Kluwer Academic Publishers, 1997, pp. 50-51.

Aspar et al., "Smart-Cut: An Original Way to Obtain Thin Films by Ion Implantation," Conference on Ion Implantation Technology, Sep. 17-22, 2000, pp. 255-260.

Auberton-Herve et al., "Smart-Cut: The Basic Fabrication Process for Unibond SOI Wafers," IEICE Transactions on Electronics, vol. E80-C, No. 3, pp. 358-363 (1997).

Search Report dated Aug. 10, 2005 from International application No. PCT/IB2004/004390.

* cited by examiner

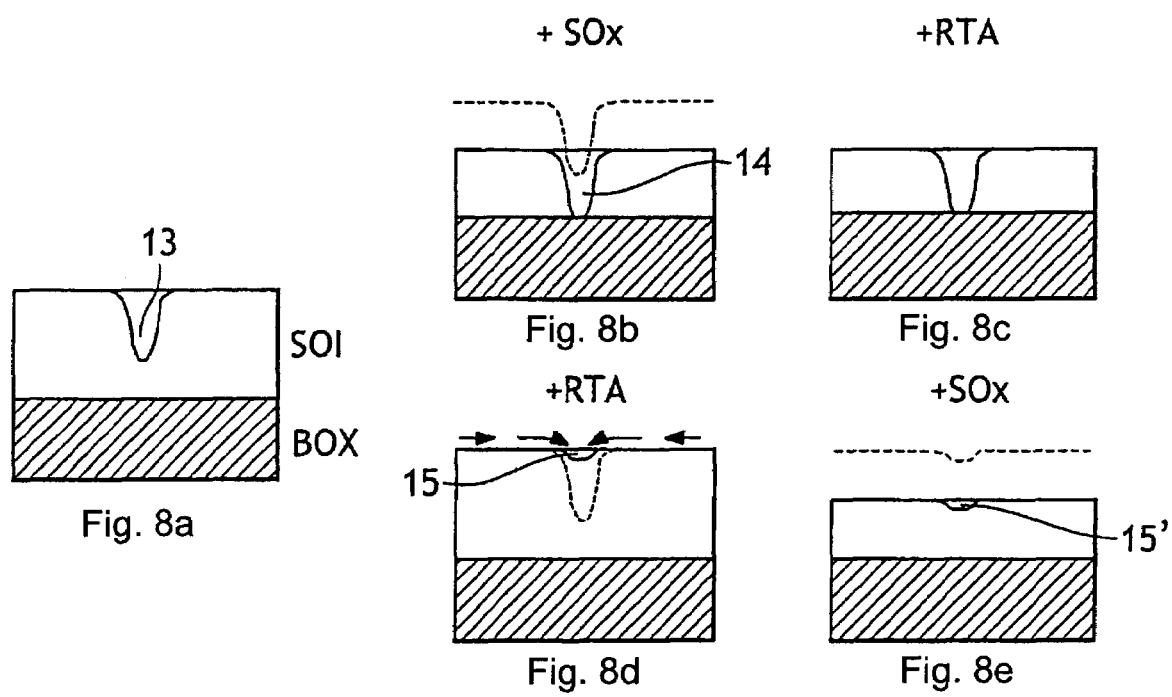

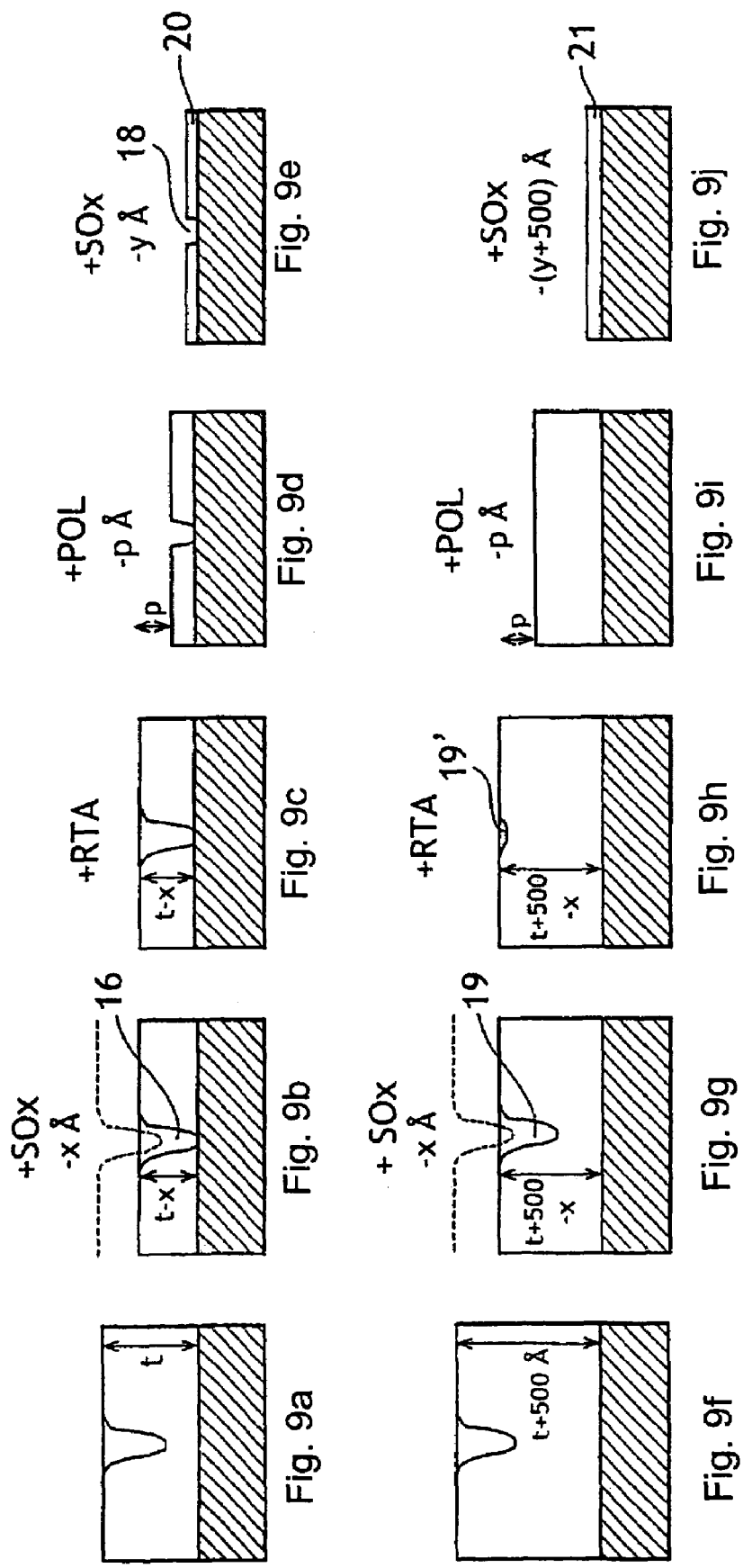

US 7,485,545 B2

METHOD OF CONFIGURING A PROCESS TO OBTAIN A THIN LAYER WITH A LOW DENSITY OF HOLES

CROSS-REFERENCE TO RELATED APPLICATIONS

This application is a continuation-in-part of international patent application PCT/IB2004/004390, filed Dec. 28, 2004, the entire content of which is expressly incorporated herein by reference thereto.

FIELD OF THE INVENTION

The present invention relates to a method for configuring a process for treating a semiconductor wafer. More particularly, the invention relates to configuring a process in which a minimum layer thickness is determined for a layer to be transferred to a donor wafer to enable finishing operations to be conducted to obtain a desired layer thickness.

BACKGROUND OF THE INVENTION

Several processes and techniques for manufacturing a crystalline wafer by transferring layers are generally known. These include, for example, the layer transfer technique reported in *Frontiers of Silicon-on-Insulator*, J. Appl. Phys. 93, 4955 (2003) by G.K. Celler et al. and based on the "SMART-CUT®" technology of Soitec S.A., which is known to those skilled in the art and descriptions of which can be found in a number of works dealing with wafer reduction techniques, such as U.S. Pat. No. 5,374,564. In the SMART-CUT® process, atomic species, such as ions, are implanted in a donor substrate to create a region of weakness therein before bonding of a handle substrate to the donor substrate. After bonding, the donor substrate splits or is cut at the region of weakness. What is obtained therefore is, on the one hand, a donor substrate, stripped of a layer of its structure, and, on the other hand, a wafer comprising, bonded together, a removed thin layer of the donor substrate and the handle substrate.

It is also known that a region of weakness can alternatively be formed in a donor substrate by forming a porous layer therein using the method known as the ELTRAN® process by Canon, described in U.S. Pat. No. 6,100,166. Additionally, various bonding techniques are generally known and include the method described in the reference entitled "Semiconductor Wafer Bonding: Science and Technology" (Interscience Technology) by Q. Y. Tong, U. Gösele and Wiley.

A process known as SMART-CUT®, which is described, for example, in the document "Silicon-On-Insulator Technology: Materials to VLSI, 2nd Edition", by Jean-Pierre Colinge from Kluwer Academic Publishers, pp. 50 and 51. The SMART-CUT® process advantageously can produce structures comprising a thin layer of semiconductor material, such as SeOI (Semiconductor On Insulator) structures and the like.

Layer transfer processes, for example SMART-CUT® processes, advantageously produce crystalline wafers or other structures that preferably include a thin layer of semiconductor material, such as SeOI (Semiconductor-On-Insulator), SOI (Silicon-On-Insulator), and SGOI (Silicon-Germanium-On-Insulator) structures and the like.

Following the detachment step, the thin layer formed onto the support substrate typically has a damaged zone extending to a certain depth from the surface at which it was detached. In this damaged zone, holes may be observed on the surface of the thin layer. Some holes, which will be referred to as "shallow holes" below, are blind holes which extend part of the way into the thickness of the thin layer. In an SOI structure, for example, these shallow holes extend into the thickness of the superficial thin silicon layer but do not extend down to the buried oxide layer.

On the other hand, some holes can be fairly deep, extending completely through the thickness of the thin layer. These through holes are also referred to herein as "killing holes". In an SOI structure for example, these killing holes can extend completely through the superficial thin silicon layer and through the buried oxide layer.

There is thus a need for a method for producing a high quality structure comprising a thin layer of semiconductor material on a substrate, which method makes it possible to minimize the density of holes within the thin layer, including the density of through holes.

SUMMARY OF THE INVENTION

The present invention relates to a method for configuring a process to treat a semiconductor wafer. The preferred embodiment includes selecting a target thickness to be obtained for a processed semiconductor layer of the semiconductor wafer, which semiconductor layer is to be transferred from a donor substrate. A target maximum density of through holes is selected, which through holes extend completely through the processed semiconductor layer. A finishing sequence of operations to be conducted on the semiconductor layer after its transfer from the donor substrate is selected for improving the surface quality of the transferred semiconductor layer to provide the processed layer. A minimum layer thickness is determined for the transfer layer, which is to be provided by providing a donor wafer than comprises the semiconductor layer and a region of weakness. The region of weakness is configured to facilitate detachment of the semiconductor layer from a remainder portion of the donor substrate. The semiconductor layer and remainder portion are disposed on opposite sides of the region of weakness. The semiconductor layer is associated with a support substrate, and the semiconductor layer is detached at the region of weakness from the remainder portion to transfer the semiconductor layer to the support substrate to provide the semiconductor wafer. This is conducted so that the transferred semiconductor layer has at least the minimum layer thickness. Additionally, the minimum layer thickness is determined such that the density of through holes is below the target maximum density after each operation in the finishing sequence. The target thickness is achieved when the finishing sequence is complete.

In the preferred embodiment, the minimum layer of thickness is determined for the transferred layer from the donor substrate. In this embodiment, the region of weakness is provided by implanting atomic species into the donor substrate. Preferably, an implantation energy is selected between about 15 keV and 120 keV for implanting the atomic species, and the implantation energy is more preferably less that 80 keV.

The finishing sequence preferably includes at least one shallow-hole reducing operation that reduces the depth of shallow holes that are present in the transferred layer, which shallow holes extend less than completely through the transferred layer. At least one shallow hole reducing operation can include a thermal annealing operation or a polishing operation. The selected finishing sequence can comprise at least one succession of a rapid thermal annealing operation and a sacrificial oxidation operation, in which the thermal annealing operation can, for example, proceed the sacrificial oxidation operation in the succession. Alternatively, the selected finishing sequence can include at least one succession of a first sacrificial oxidation operation, followed by a polishing operation, followed by a second sacrificial oxidation operation. In another finishing sequence, a succession of operations includes a first sacrificial oxidation operation, followed by a rapid thermal annealing operation, followed by a polishing operation, followed by a second sacrificial oxidation operation.

The minimum layer thickness can be determined for the transferred layer that is associated with the support, wherein an insulating layer is disposed between the transferred layer and the support substrate to provide an SOI wafer. The transfer layer can be made of silicon, the insulator layer be made of an oxide to provide the SOI wafer after detachment. In embodiments to prepare an SOI wafer, the selected finishing sequence can comprise, for example, at least two sequential successions, each succession comprising a rapid thermal annealing operation, followed by a sacrificial oxidation operation. The target maximum density of through holes can be about $0.1/cm^2$ in this embodiment.

One embodiment includes determining a depth in the donor wafer in which the region of weakness is to be provided to obtain the transferred layer having the determined minimum thickness. Another embodiment includes providing the semiconductor wafer with the transferred layer of at least said determined minimum thickness and a preexisting surface quality, and conducting the selective finishing operations to obtain the processed layer. In this embodiment, the processed layer has the improved surface quality compared to the surface quality of the transferred layer, substantially the target thickness, and substantially the target maximum density of through holes or less. The region of weakness is preferably provided at a depth in the donor wafer that is substantially equal to or greater than the determined minimum thickness.

Another embodiment of a method configuring the process of treating the semiconductor wafer includes determining a minimum layer thickness of a transfer layer, which is associated with a support substrate that has a transferred surface quality, to obtain a processed layer that has a pre-selected target thickness and a target maximum density of through holes that extend completely therethrough. This processed layer has been obtained by conducting a predetermined finishing sequence of operations to improve the surface quality of the processed layer compared to the transferred surface quality. Additionally, the minimum thickness is determined such that the density of through holes is below the target maximum density after each operation in the finishing sequence.

BRIEF DESCRIPTION OF THE DRAWINGS

Other characteristics, purposes and advantages of the invention will appear to the reading of the following detailed description, with respect to the annexed drawings, given as non restrictive example, in which:

FIGS. 8a-8e show the effect of sequences RTA-SOx and Sox-RTA on an SOI structure;

FIGS. 9a-9j show the effects of an embodiment of the inventive method;

DETAILED DESCRIPTION OF THE PREFERRED EMBODIMENTS

Figure 1:
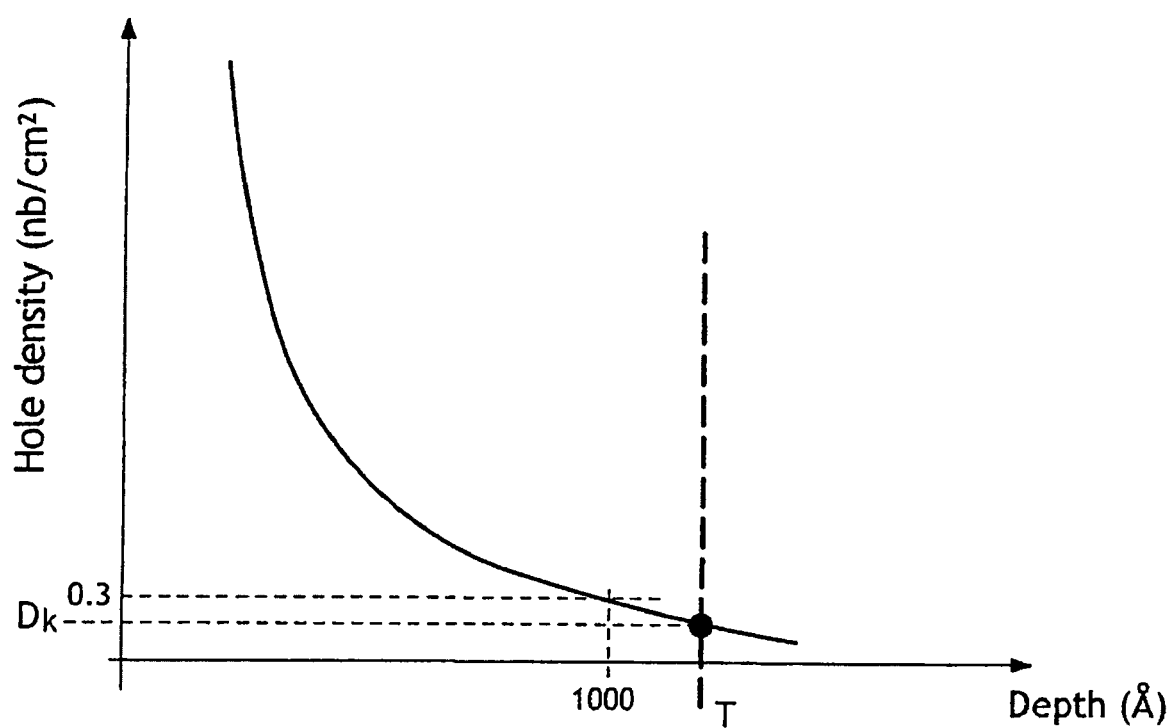
FIG. 1 schematically represents the hole density as a function of depth within a thin layer.

The present invention relates to a method for producing a final structure comprising a thin layer of semiconductor material on a substrate. One embodiment comprises the steps of:
creating region of weakness in the thickness of a donor substrate,
placing the donor substrate into close contact with a support substrate,
detaching the donor substrate at the level of the region of weakness to transfer a part of the donor substrate onto the support substrate.

The invention allows production of improved properties of the thin layer, preferably by avoiding the presence of holes within the thin layer.

A layer transfer process, such as SMART-CUT®, can be used. The region of weakness can be created by implantation of atomic species within the thickness of the donor substrate. Implantation of atomic species is understood to mean any technique (such as bombardment, diffusion and the like) suitable for introducing atomic or ionic species onto the material of the implanted donor substrate, with a maximum concentration of the implanted species situated at a preset depth from the substrate relative to the surface of said implanted substrate.

When an SeOI structure is to be produced, a layer of oxide can be provided between the support substrate and the thin layer. For this purpose, the donor substrate may comprise on its top a superficial oxide layer which is to be placed, after the implantation step, into close contact with the support substrate so as to form the buried oxide layer of the final SeOI structure.

The implantation step can be performed either by implanting a single atomic species (such as hydrogen) or by co-implanting at least two different species (such as the co-implantation of both hydrogen and helium). The term "atomic species implantation" means any bombardment of atomic species, including molecular and ionic species, which can introduce the species into a material, with a maximum concentration of the species being located at a depth that is determined with respect to the bombarded surface. The molecular or ionic atomic species are introduced into the material with an energy that is also distributed about a maximum.

As indicated above, following the detachment step, the thin layer formed onto the support substrate typically has a damaged zone that can include shallow holes, which extend part of the way into the thickness of the thin layer, but do not extend down to the buried oxide layer in a typical SOI wafer, and killing holes or through holes, which extend completely through the thickness of the thin layer, and can extend through the buried oxide layer as well. The significance of the through holes is significant when the thickness of the thin layer is small (for instance less than 800 angstroms).

The resulting structures from SMART-CUT® type processes are used for applications in the fields of microelectronics, optics and/or optronics. Holes are thus to be as much as possible avoided, and functional components cannot be built on a through hole. Shallow hole are not as detrimental to the operation of the components built thereon, but they form defects that are desirable to be avoided.

A first embodiment of an inventive method for producing a final structure comprising a thin layer of semiconductor material on a substrate, comprises the steps of:
- creating region of weakness in the thickness of a donor substrate,
- placing the donor substrate into close contact with a support substrate, and
- detaching the donor substrate at the level of the region of weakness to transfer a part of the donor substrate onto the support substrate, thus forming an intermediate structure.

The preferred method also comprises the steps of:
- selecting:
  - a thickness that is to be reached for the thin layer of the final structure,
  - a maximum density of through holes to be observed within the thin layer of the final structure,
  - a finishing sequence comprising at least one operation to be performed on the intermediate structure obtained after detachment;
- determining a minimum thickness of the part of the donor substrate to be transferred onto the support substrate such that the part:
  - presents, after each operation of the finishing sequence, a density of killing holes less than the selected maximum density,
  - and to reach said selected thickness once the finishing sequence is completed.

Preferred embodiments of an inventive method can include the following:
- the region of weakness is created in the thickness of the donor substrate at a depth substantially equal to or greater than the determined minimum thickness to be transferred;
- the region of weakness is created by implantation of atomic species through a face of the donor substrate from which the thin layer is made, according to implantation conditions selected for creating the region of weakness below the selected thickness;
- the thickness selection takes into account the selected maximum through holes density, the selected final thickness, and the effect of each operation of the finishing sequence upon the holes density;
- the method comprises the step of selecting implantation conditions by selecting an implantation energy between about 15 keV and about 120 keV, and preferably between about 15 keV and about 80 keV;
- the finishing sequence comprises at least one shallow holes depth reducing operation;
- the finishing sequence comprises a plurality of shallow holes depth reducing operations;
- the finishing step comprises at least one thermal annealing (TA) operation, as a shallow holes depth-reducing operation;
- the finishing step comprises at least one polishing (POL) operation, as a shallow holes depth-reducing operation;
- the finishing sequence comprises at least one succession of the following operations: rapid thermal annealing (RTA) followed by sacrificial oxidation (SOx);
- the finishing sequence comprises at least one succession of the following operations: sacrificial oxidation (SOx) followed by rapid thermal annealing (RTA);
- the finishing sequence comprises at least one succession of the following operations, preferably in the following order: sacrificial oxidation (SOx), polishing (POL), and SOx;
- the finishing sequence comprises at least one succession of the following operations, preferably in the following order: sacrificial oxidation (SOx), rapid thermal annealing (RTA), polishing (POL), and SOx;
- a layer of oxide is interposed between the thin layer and the support substrate, the structure thus produced being a SeOI (Semiconductor On Insulator) structure;
- the thin layer is formed from silicon, the structure thus produced being an SOI (Silicon On Insulator) structure.

The invention also relates to the structures obtained by the method according to the invention, such as an SeOI structure produced by the method according to the inventive method first, wherein the finishing sequence comprises an RTA/SOx/RTA/SOx sequence of operations, such that the killing holes density of the thin layer of the final structure is around $0.1/cm^2$.

The minimum thickness of the donor substrate port to be transferred to the support substrate can be selected or determined:
- to have, after each operation of the finishing sequence, a density of killing holes less than said maximum density, and
- to reach the selected thickness once the complete finishing sequence is completed.

The present invention can help improve the quality of a structure obtained by carrying out a transfer process of the SMART-CUT® type. The structure can, in general, be any type of structure comprising a thin layer of semiconductor material on a surface exposed to the external environment. The thin layer of semiconductor material can be, for example, silicon Si, silicon carbide SiC, germanium Ge, silicon-germanium SiGe, gallium arsenide GaAs, or another suitable material. The substrate support can be made of silicon Si, quartz, or another suitable material.

As mentioned above, a layer of oxide can also be interposed in between the support substrate and the thin layer, the structure therefore formed being a SeOI (Semiconductor On Insulator) structure.

The embodiment described hereafter deals with SOI (Silicon On Insulator) structures manufacturing, but one of ordinary skill in the art will understand that the invention is can be applied to other embodiments. FIG. 1 represents the hole density as a function of depth within an SOI transferred layer. The hole density is inversely proportional to the depth, and decreases quasi exponentially. Typically the deepest holes are between 1000 and 1400 angstroms deep, but their density is then relatively weak (typically the density of the holes deeper than 1000 angstroms is below 0.3 holes per $cm^2$). The hole density is typically similarly distributed whether the implantation step is carried out by implanting a single atomic species or by co-implanting at least two different species.

A killing hole is a hole with a depth at least equal to the thickness of the thin layer. Hence, as illustrated on FIG. 1, the killing hole density Dk is directly related to the thin layer thickness T. This killing hole density is thus all the more significant and typically higher when the thickness of the thin layer is low. Hence, a thin SOI layer traditionally has a high killing holes density, whereas a thick SOI layer traditionally has a low killing holes density. As illustrated by FIG. 1, an SOI layer with a thickness T greater than 1000 angstroms typically has a killing holes density Dk less than 0.3/cm².

Several finishing steps of the structure obtained after detachment can be used to form a thin layer suitable for a use in the field of microelectronics, optics and/or optronics. These finishing steps generally make use of operations such as polishing (referred to as "POL" hereinbelow), thermal annealing in a neutral or reducing atmosphere (referred to as "TA" hereinbelow; such as a rapid thermal annealing ("RTA")), sacrificial oxidation (referred to as "SOx" hereinbelow), chemical etching, etc. RTA is generally understood herein to mean rapid thermal annealing, performed over a period of several seconds or several tens of seconds, preferably at least 5 seconds, more preferably at least 10 seconds, and most preferably at least 20 seconds, preferably up to about 10 minutes, more preferably up to about 2 minutes, more preferably up to a minute, and most preferably up to about 45 seconds (RTA in a preferred embodiment is conducted for around 30 seconds). RTA is generally also understood herein to be conducted at a high temperature, for example of the order of 900° C. to 1300° C., in a controlled atmosphere, such as a mixture of hydrogen and argon, or an atmosphere of pure argon, or even an atmosphere of pure hydrogen. In one embodiment, RTA is conducted for between 20 and 40 seconds, and more preferably around 30 seconds.

SOx is a sacrificial oxidation divided into an oxidation step and a deoxidation step, a heat treatment step (typically around two hours long at 1100° C.) being preferably conducted between the oxidation and deoxidation steps. Chemical-mechanical polishing ("CMP") is an example of a POL operation.

The following sequences of operations have for instance been proposed as finishing step of the structure obtained after detachment:

SOx-POL-SOx (refer for instance to publication FR 2 797 174);

SOx-RTA-POL-SOx (refer for instance to publication FR 2 797 713);

RTA-SOx-RTA-SOx (refer for instance to the Applicant's French patent application filed on Jul. 27, 2003 under n° 03 09304).

As concerns holes, the applicant has observed that the above mentioned operations can be separated into two families. A first family concerns those operations that allow reducing the depth of the shallow holes, that is those holes which depth is lower than the thickness of the thin layer being formed (such as those holes which do not extend down to the underneath buried oxide layer in the case of an SOI structure). A second family concerns those operations which do not have any curing impact on holes. RTA and POL operations are instances of the first family, whereas SOx and chemical etching operations are instances of the second family.

FIGS. 2a-2d illustrate the effect of an RTA operation on SOI structures 1a, 1b composed respectively of a silicon layer 2a, 2b on top of a buried oxide layer 3a, 3b (the support substrates not being represented). Silicon layer 2a of SOI structure 1a presents a shallow hole 4a, the depth of which is lower than the thickness of the silicon layer 2a and thus does not extend down to the surface of the buried oxide layer 3a. On the contrary, silicon layer 2b of SOI structure 1b presents a through hole 4b which extends completely through the thickness of the silicon layer 2b, down to the surface of the buried oxide layer 3b.

Figure 2A:
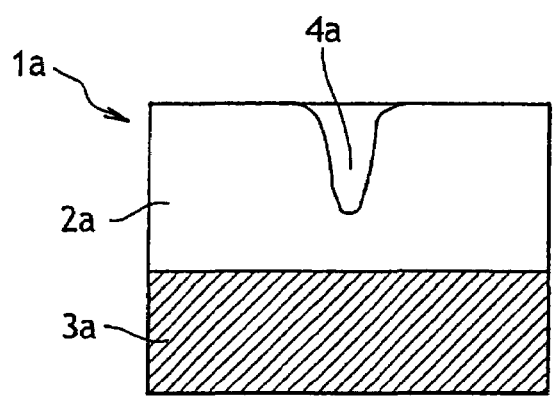
FIGS. 2a-2d illustrate the effect of an RTA operation on SOI structures.
Figure 2B:
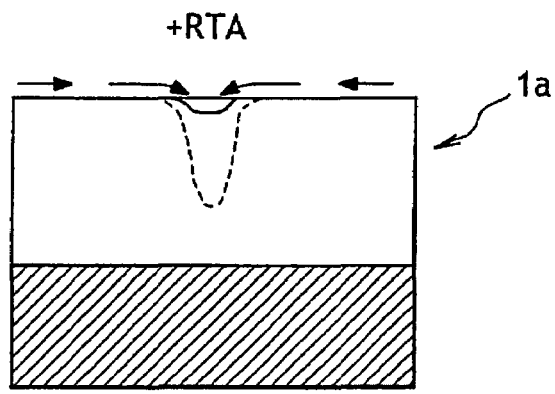
Figure 2C:
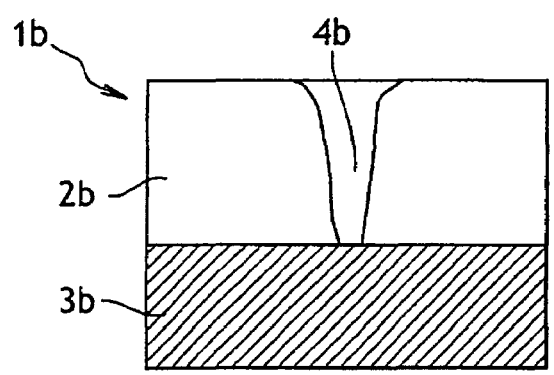
Figure 2D:
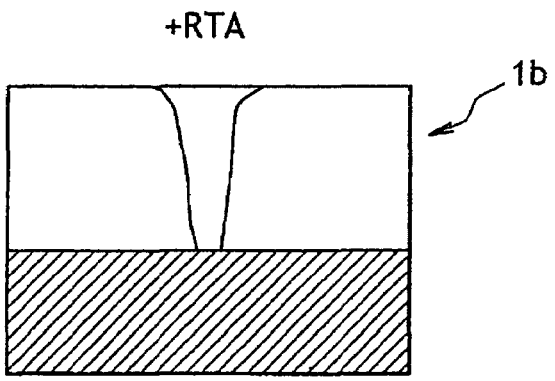

The RTA operation has a smoothing effect that significantly decreases (by a factor two to three at least) the depth of the shallow holes (such as shallow hole 4a). Indeed these holes can be eliminated, in particular thanks to diffusion and recrystallization, as it is schematically represented on the right hand side of FIG. 2 in respect of structure 1a. However an RTA operation has no effect on the through holes (such as hole 4b) which extend, prior to the RTA, completely through thin layer 2b (in this case down to the surface of the buried oxide layer 3a). As is schematically represented in FIG. 2d in structure 1d through holes are not cured by an RTA operation.

Figure 3A:
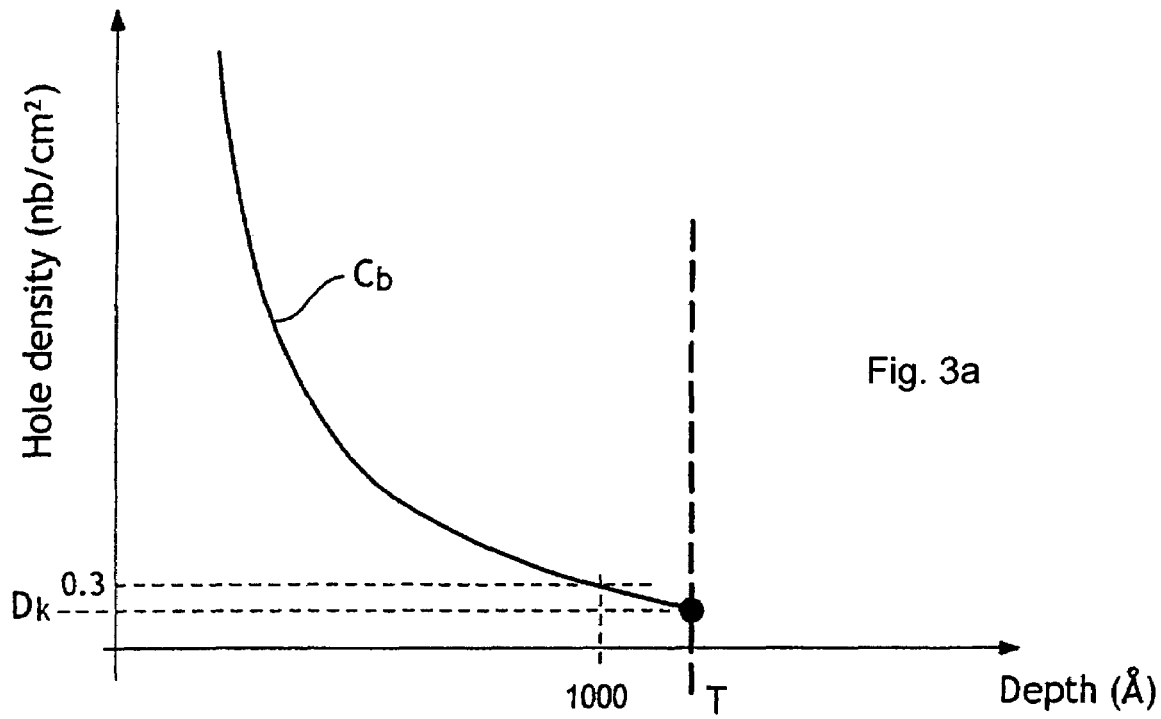
FIGS. 3a and 3b show the hole density within an SOI layer before and after an RTA operation, respectively.
Figure 3B:
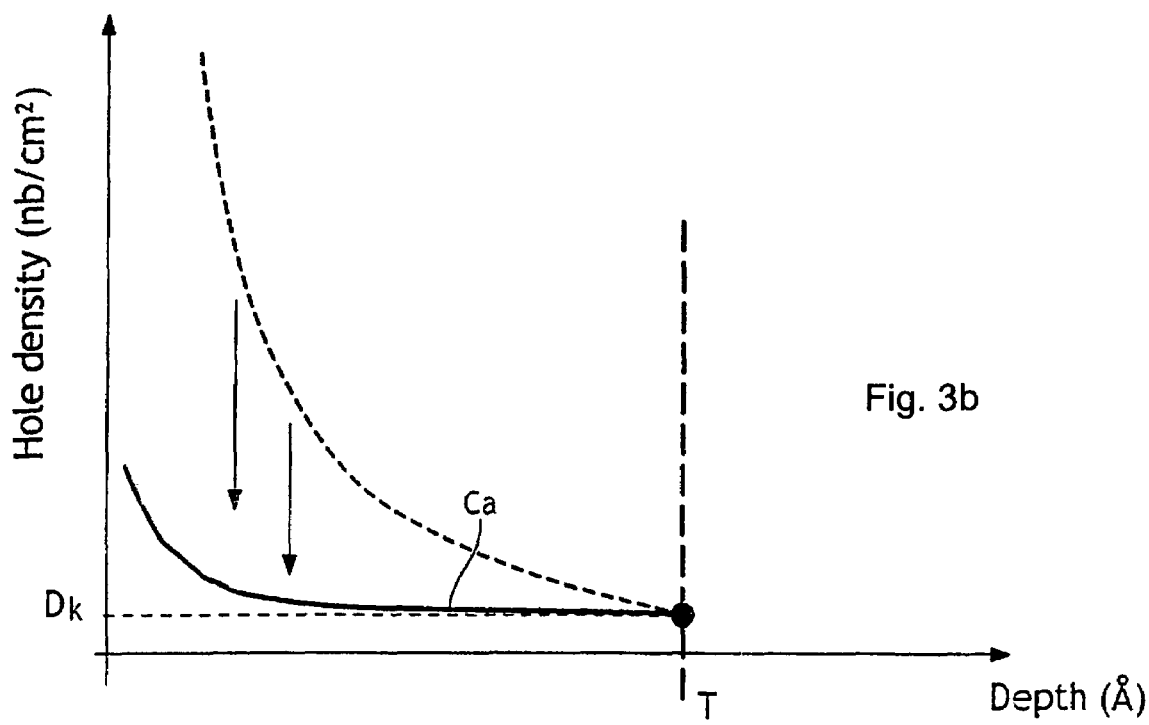

FIGS. 3a and 3b represent the hole density within an SOI layer before (top graph) and after (lower graph) an RTA operation. Before the RTA operation, the SOI layer of thickness T presents more or less deep shallow holes, in a density, illustrated by curve Cb, which depends upon the depth of these holes. The SOI layer also presents through holes in a density Dk.

As mentioned here above, the RTA operation has no effect on through holes. The through holes density thus remains unchanged and equal to Dk. However, the RTA operation helps to cure the shallow holes by decreasing their depth and even by eliminating them. As a result of the RTA operation, the SOI layer presents shallow holes in a highly decreased density, as illustrated by curve Ca.

Figures 4A, 4B:
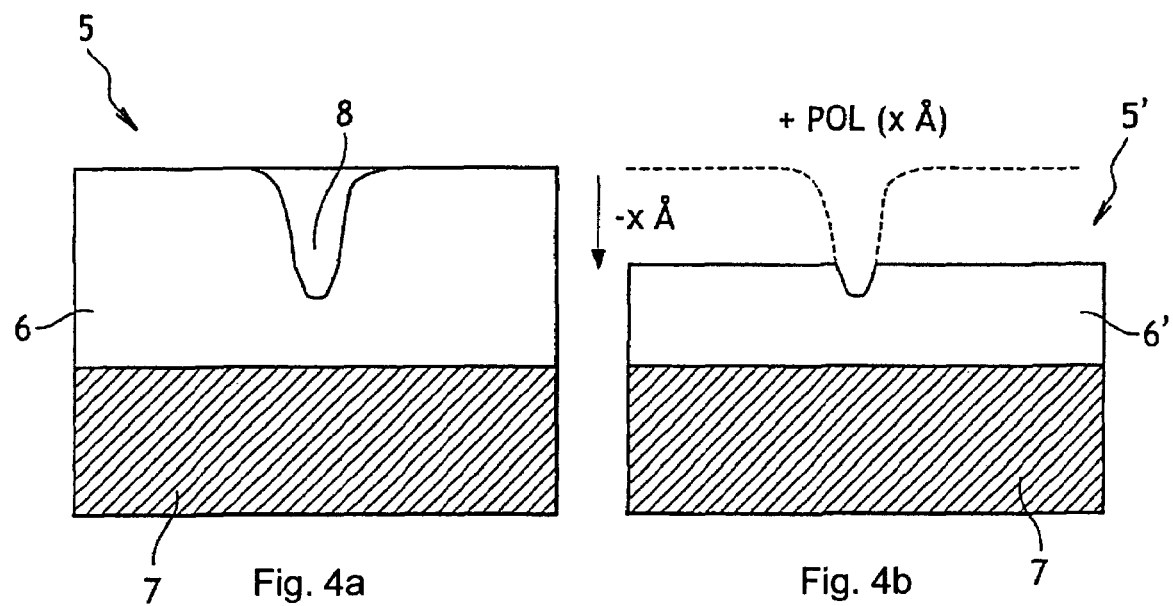
FIGS. 4a and 4b illustrate the effect of a POL operation effect on an SOI structure.

FIGS. 4a and 4b illustrate the effect of a POL operation on an SOI structure 5 composed of a silicon layer 6 on top of a buried oxide layer 7. The silicon layer 6 presents prior to the POL operation a shallow hole 8. As it is apparent in FIG. 4b, by removing x angstroms of the silicon layer 6, thus obtaining a thinned silicon layer 6', the depth of the shallow hole 8 is decreased.

Furthermore, the thickness of the silicon layer 6 being removed by the POL operation can be adjusted (being more important than the shallow hole depth) in order for said shallow hole to be removed by the POL operation. However, one understands that if the silicon layer presents a through hole which extends down to the buried oxide layer, after polishing said silicon layer will still present this killing hole.

Figure 5A:
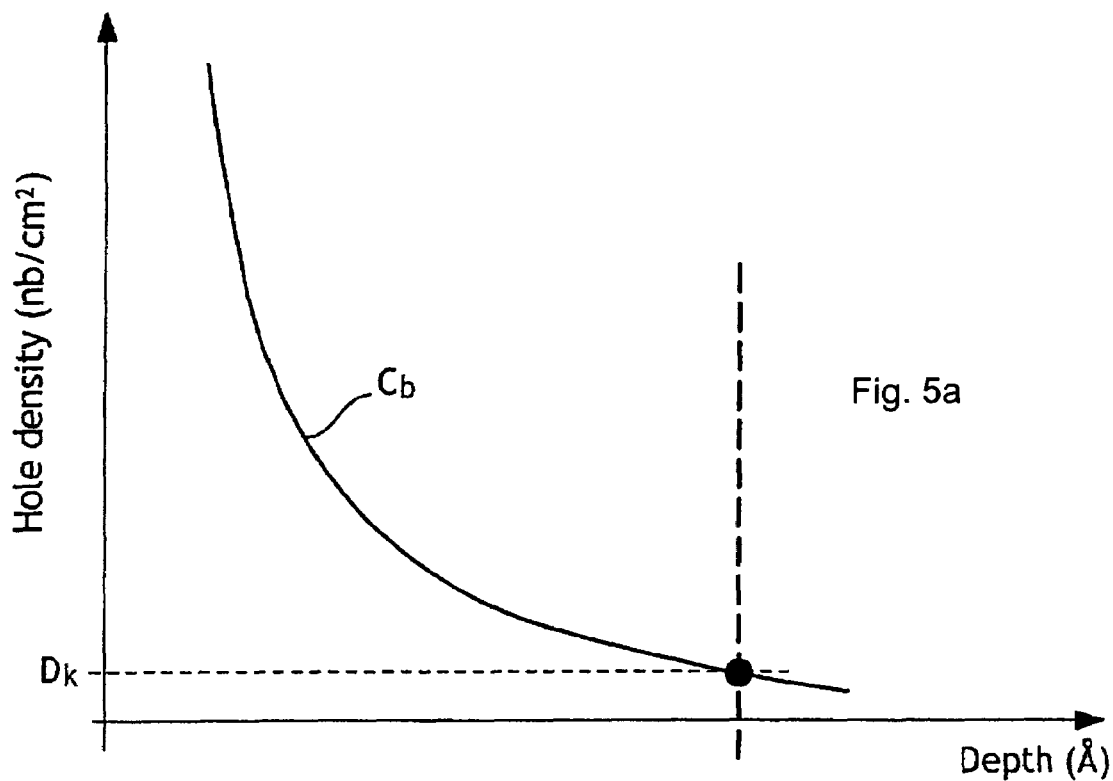
FIGS. 5a and 5b show the hole density within an SOI layer before and after a POL operation, respectively.
Figure 5B:
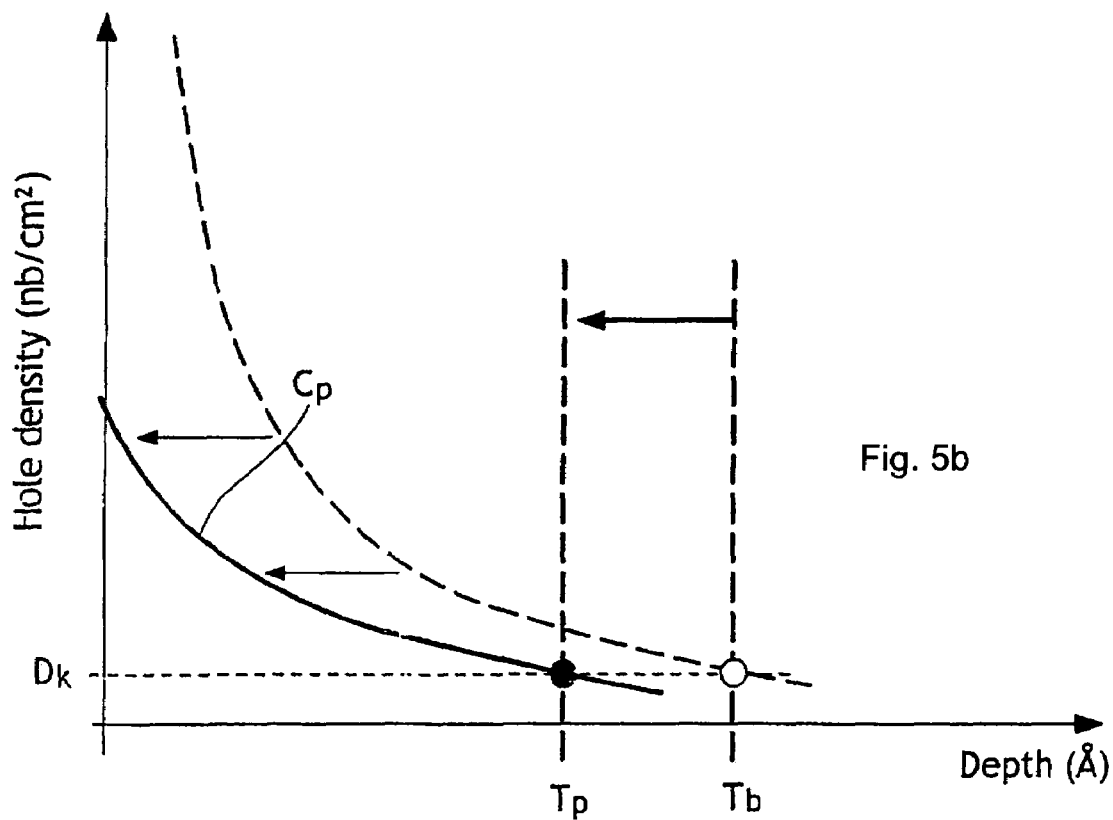

FIGS. 5a and 5b represent the hole density within an SOI layer before (top graph) and after (lower graph) a POL operation. Before the POL operation, the SOI layer of thickness Tb presents more or less deep shallow holes, in a density illustrated by curve Cb, which depends upon the depth of these holes. The SOI layer also presents through holes in a density Dk. As mentioned above, the POL operation has no effect on through holes. The through holes density thus remains unchanged equal to Dk.

However, the POL operation helps to cure the shallow holes, by decreasing their depth and even by eliminating them. As a result of the POL operation, the SOI layer presents shallow holes in a strongly decreased density, as illustrated by curve Cp (which is identical to curve Cb but shifted along the depth axis due to the POL thickness consumption).

Figures 6A, 6B:
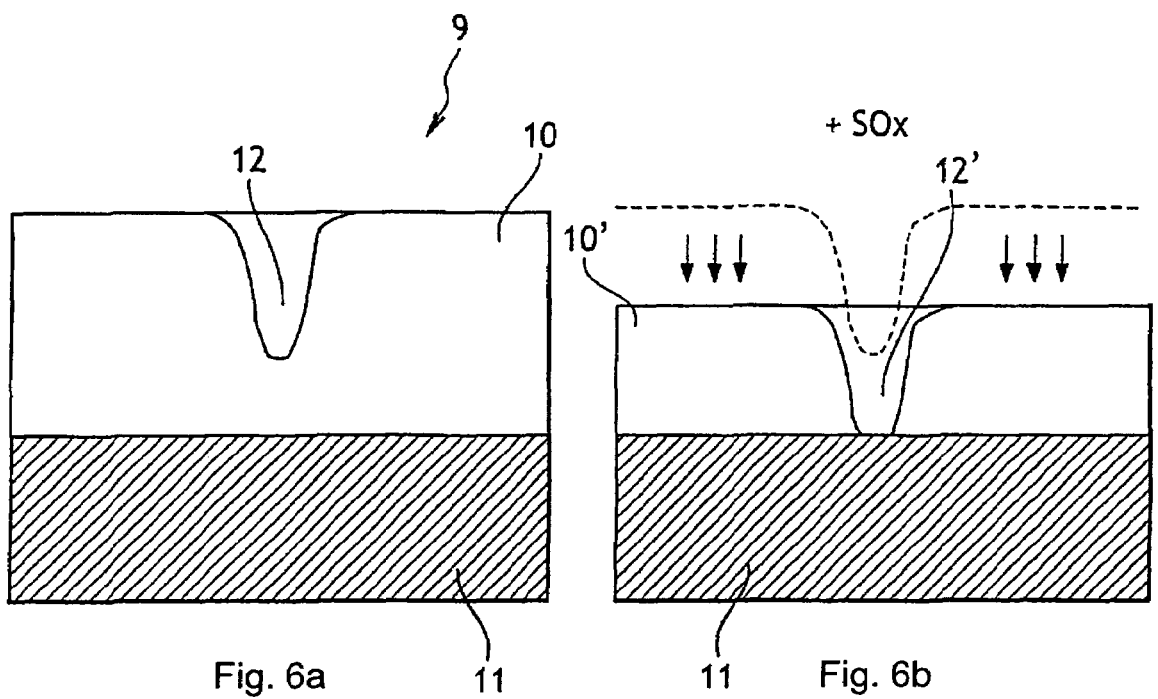
FIGS. 6a and 6b illustrate the effect of an SOx operation on an SOI structure.

FIGS. 6a and 6b illustrate the effect of an SOx operation on an SOI structure 9 composed of a silicon layer 10 on top of a buried oxide layer 11. The silicon layer 10 presents prior to the SOx operation a shallow hole 12. As is apparent in FIG. 6b, the SOx operation reproduces the shape of the hole and does not modify its depth until it becomes a through hole when the depth equals the thickness of the material. As illustrated, if the depth of the initially present shallow hole 12 is sufficient, it is possible that this hole extends, after an SOx operation, down to the buried oxide layer (becoming a through hole 12').

Figure 7A:
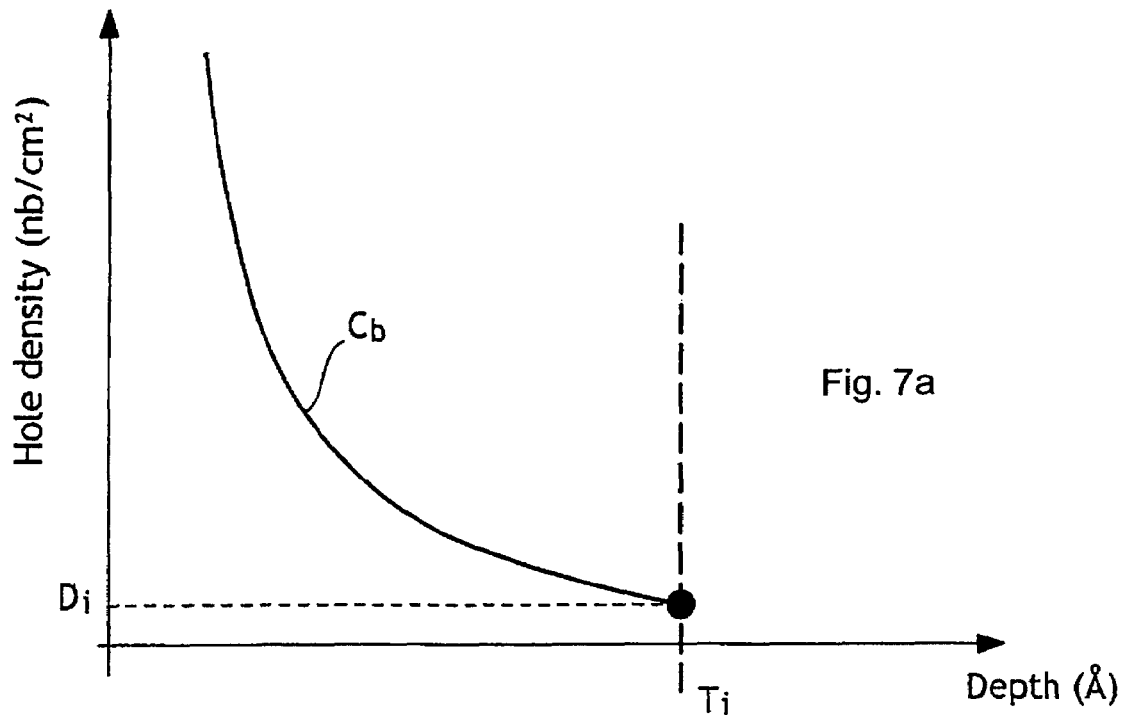
FIGS. 7a and 7b show the hole density within an SOI layer before and after an SOx operation, respectively.
Figure 7B:
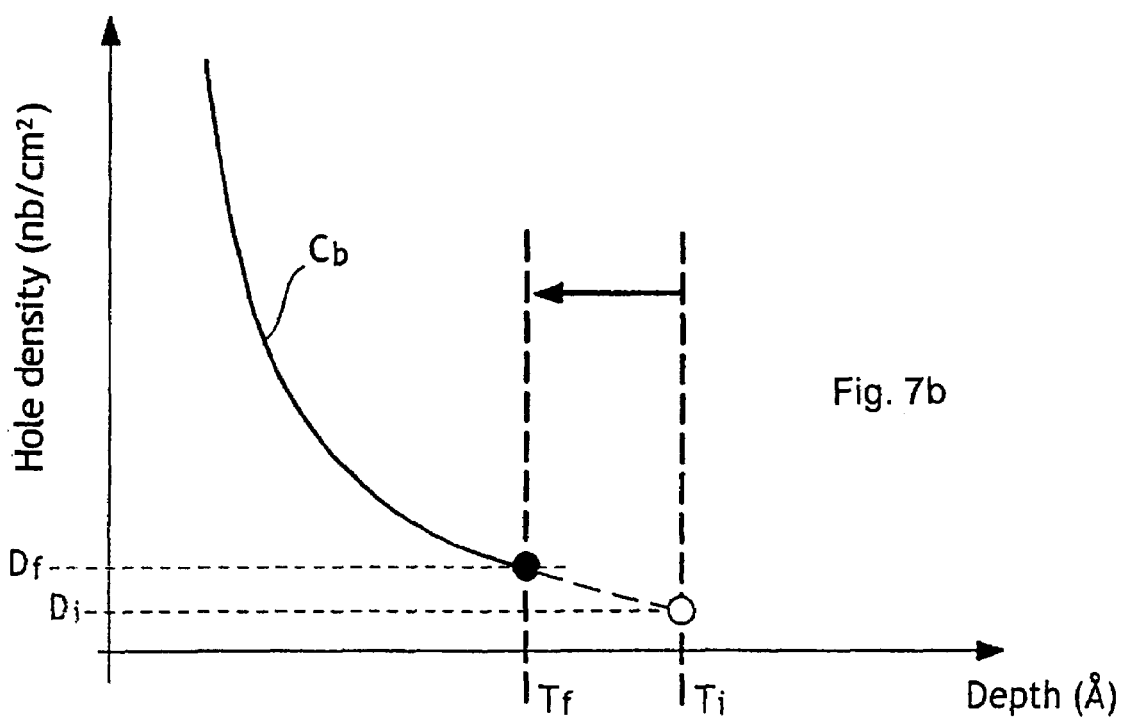

FIGS. 7a and 7b represent the holes density within an SOI layer before (top graph) and after (lower graph) an SOx operation. Before the SOx operation, the SOI layer of thickness Ti presents more or less deep shallow holes in a density, illustrated by curve Cb, which depends upon the depth of these holes. The SOI layer also presents through holes in a density Di.

As mentioned here above, the SOx operation reproduces the shape of the holes and does not modify their depth. The shallow holes density is thus unchanged, and depends upon their depth as illustrated by the unchanged curve Cb. However the thickness of the SOI layer is decreased by the SOx operation. As the new thickness Tf is lower than the initial thickness Ti, the density of through holes thus increased from Di to Df.

As is apparent from FIG. 7a and 7b, an SOx operation does not help to cure shallow holes, and increases the killing holes density (this increase relating directly to the consumed thickness Ti-Tf). As, for the SOx operation, a chemical etching operation reproduces the shape of the hole and does not modify its depth. As for the SOx operation, this even results in an initially relatively deep shallow-hole extending subsequently down to the buried oxide layer, and being thus "converted" to a through hole (or otherwise stated, it results in an increase of the through holes density).

As has been stated hereabove, a through hole present prior to an operation of the first family (such as an RTA or POL operation), will not be cured by said operation. Hence, as it is apparent on FIGS. 8a-8e, sequences RTA-SOx and Sox-RTA with the operations conducted in the order in which they are listed, have a very different effect.

In the Sox-RTA sequence case, it is possible that the SOx operation transforms an initially (after layer transfer) shallow hole 13 into a through hole 14. This through hole 14 will not be cured by the following RTA operation. On the other hand, in the RTA-SOx sequence case the same initially shallow hole 13 can be cured. Indeed the RTA operation will decrease its depth (see hole 15) while the SOx will thin the silicon layer. The resulting structure thus presents an almost entirely eliminated hole 15', with greatly reduced depth. If through holes are present after transfer within the thin layer, these holes will not be cured and will remain, as killer defects in the final product.

Based on the above observations, the method according to the invention proposes to perform the steps of:
 selecting a thickness which is to be reached for the thin layer of the final structure,
 selecting a maximum density of through holes to be observed within the thin layer of the final structure, and
 selecting a finishing sequence comprising at least one operation to be performed on the intermediate structure obtained after detachment.

A particular finishing sequence is generally used on the structure following the detachment step so as to improve the quality of the thin transferred layer (for instance by gummning out the roughnesses, insuring a correct thickness uniformity) and make it suitable for a use in the fields of application. This finishing sequence is notably adapted for thinning the part of the donor substrate transferred onto the support substrate (thin transferred layer) so that the thickness of the thin layer of the final structure reaches said selected thickness.

The finishing sequence may comprise at least one of the above mentioned operations (TA, POL, SOx, chemical etching) and may include any combination of these operations, such as the following sequences, which are given as non restrictive examples:
 RTA-SOx;
 repetition of several RTA-SOx sequences (such as RTA-SOx-RTA-SOx);
 SOx-POL-SOx (and any repetition of this sequence);
 SOx-RTA-POL-SOx (and any repetition of this sequence);
 SOx-RTA (and any repetition of this sequence).

As mentioned above, an RTA operation (and more generally any smoothing annealing operation) helps stopping shallow holes. It is thus advantageous to make use of a sequence comprising such an RTA operation.

Moreover, under particular conditions, an RTA operation helps encapsulate the oxide layer under a Si layer, which may be favourable before performing a chemical etching or a sacrificial oxidation (see for instance WO 2004/079801). However the order (defined in terms of remaining thickness) of such an operation within a particular sequence may be important (see for instance US 2004/0151483).

Furthermore, an RTA operation is not effective for carrying out a removal of material and thinning the thin layer. On the contrary, an SOx operation is effective for thinning the thin layer, in particular for removing the zone which is damaged after detachment or for obtaining the selected thickness of the thin layer of the final structure. The thickness that can be removed by an SOx operation is typically comprised between about 100 and 1000 angstroms. However an SOx operation must be carefully performed as it may increases the through holes density. It may hence be judicious to perform an RTA operation between two SOX operations.

A POL operation also helps thinning the thin layer by material removal, but such an operation results in a degradation of the thickness uniformity and even in the thin layer being damaged. A POL operation has thus to be limited as much as possible, and to be performed after a thinning step (such as an SOx) which damages the thin layer less, or even after an RTA. Typically a POL operation is combined with an RTA so as to limit the removal of material between about 200 and 500 angstroms (which helps to limit the thickness uniformity degradation).

The method according to the invention also proposes to perform the step of determining a minimum thickness of the part of the donor substrate which has to be transferred onto the support substrate for said part to present, after each operation of the finishing sequence, a density of through holes less than the desired maximum density, and to reach said selected thickness once achieving the finishing sequence.

Hence the invention proposes to limit the density of through holes within the thin layer of the final structure by selecting an adequate thickness to be transferred onto the support substrate and taking into account:
 the selected thickness which is to be reached for the thin layer of the final structure,
 the selected finishing sequence of operation(s) (and thus taking into account the effect upon holes density of each operation of this finishing sequence).

The above discussed graphs (FIGS. 3a, 3b, 5a, 5b, 7a, and 7b) show the effect upon holes density of each type of operation (RTA, POL and SOx). These graphs may hence be combined to evaluate the effect upon holes density of a complete finishing sequence (which may have several operations performed in a particular order, and which is adapted for thinning the thin layer to the selected thickness).

The appropriate thickness to be transferred can thus be derived from this combination of graphs so that after each operation, the through holes density is less than the selected maximum through holes density. Starting from the selected final thickness and maximum density of through holes, it is hence possible to determine, (such as by taking the operation(s) of the finishing sequence in their reverse order and starting from the last one) which minimum thickness the thin layer must present before a particular operation, and thus finally which thickness has to be transferred.

Taking the diagrams of FIGS. 8b and 8c as an illustrative example, the selected finishing sequence comprises an SOx operation followed by an RTA operation. Graphs of FIGS. 3a, 3b, 7a, and 7b are thus to be combined. The minimum thickness Ti to be transferred must take into account the fact that the thickness of the thin layer is decreased by the SOx operation (decreasing from Ti after transfer to Tf after the SOx operation), which results in an increase of the through holes density.

Let's consider than the selected maximum density is set to 0.3 through holes per $cm^2$. The minimum thickness Ti to be transferred must then be chosen so that the thickness Tf after the SOx operation and thus before the RTA operation (which has no impact upon through holes density but helps lowering the shallow holes density) is greater than the thickness for which a through holes density of $0.3/cm^2$ is obtained (that is greater than 1000 angstroms).

Turning now to the graph of FIGS. 8d and 8e, the selected finishing sequence now comprises an RTA operation followed by an SOx operation. Graphs of FIGS. 3a, 3b, 7a, and 7b are thus to be combined. In this case, the first operation does not reduce the thickness of the thin layer but modifies the holes density such that the subsequent SOx operation does not tend to create (a lot of) new through holes (SOx operation as illustrated on FIGS. 7a and 7b but starting from a reduced holes density profile after the RTA operation as illustrated by curve Ca on the graph of 3b). Hence, it is understood that for a selected final thickness and a selected maximum density of killing holes, the minimum thickness to be transferred in the case of an RTA-SOx finishing sequence is different (in the present case lower) than the minimum thickness to be transferred in the case of an SOx-RTA finishing sequence. The region of weakness is created in the thickness of the donor substrate at a depth substantially equal to or greater than said determined minimum thickness to be transferred. According to a possible embodiment, the region of weakness is created by implantation of species under a face of the donor substrate from which the thin layer must be made. Such an implantation can be performed by implanting a single species (such as hydrogen) or by implanting at least two different species (such as the co-implantation of helium and hydrogen). According to a preferred embodiment of the invention, implantation conditions are selected so that the implantation energy is between about 15 keV and 120 keV, and more preferably between about 15 keV and 80 keV.

According to a preferred embodiment, the finishing sequence comprises at least one operation from said first family of operations, that is an operation which allows reducing the depth of the shallow holes and helps modifying the holes density within the thin layer (see effect of an RTA and of a POL operation on FIGS. 3a, 3b, 5a, and 5b). Said shallow holes depth reducing operation is for instance a TA operation or a POL operation.

According to an advantageous embodiment of the present invention, the finishing sequence comprises a plurality of operations from said first family of operations, that is a plurality of operations that each allows reducing the depth of shallow holes. This advantageous embodiment brings an additional benefit as it decreases the depth of the residual shallow holes, and may even help to remove these shallow holes completely.

FIGS. 9f-9j give an example of the amelioration brought by a possible embodiment of the method according to the invention wherein the finishing sequence is an SOx-RTA-POL-SOx sequence of operations. Graphs of FIGS. 3b, 5b, and 7b are thus to be combined to determine, taking into account the selected thickness to be reached and the selected maximum density of through holes, the minimum thickness which is to be transferred for the thin transferred layer to present, after each of these operations, a density of killing holes less than said selected density.

In FIGS. 9a-9e, the implantation step is carried out classically so that a layer of thickness t is transferred onto the donor substrate. In FIGS. 9f-9j, the implantation step is carried accordingly to the invention so that a layer of thickness t+500 angstroms is transferred onto the donor substrate.

In the classical case of FIGS. 9a-9e, the first SOx operation does not cure shallow holes and even leads to the formation of through holes (such as hole 16) extending down to the buried oxide layer. These through holes can not be cured by the following RTA operation, nor by the following POL operation. The final SOx operation will lead to an SOI structure having a through hole 18, and being thus not acceptable for manufacturing a semiconductor device.

On the other hand, in the case of the method according to a possible embodiment of the invention shown in FIGS. 9f-9j, the transferred layer is thick enough for killing holes not to be formed (in a too important density exceeding the selected maximum density) by the first SOx operation. Thus, in this case the subsequent RTA operation in FIG. ___ (that is an operation allowing to reduce the depth of shallow holes, such as hole 19) will help to cure the present shallow holes, notably by decreasing their depth (see hole 19'). This RTA operation has no impact upon the through holes density, so that after this operation, the through holes density still does not exceed the selected maximum density. The POL operation will remove those shallow holes which are included within the thickness of the thin layer which is removed by this operation (in this case, those holes that are less deep than p angstroms, such as hole 19'). The POL operation will decrease the depth of the shallow holes that were, prior to this operation, deeper than p angstroms. As for the RTA operation, the POL operation does not impact the through holes density. Finally, at the end of the last operation (second SOx operation), a thin layer is obtained which presents the desired thickness, and a minimized density of holes, and in particular few shallow holes and a killing holes density less than said selected maximum density.

It should be noted that this second SOx operation carries out a sacrificial oxidation adapted for obtaining a final thin layer 21 whose thickness is similar to that of the thin layer 20 classically obtained. Hence this second SOx operation carries out a more important sacrificial oxidation, adapted to compensate for the thickness increase (+500 angstroms in the present case) of the transferred layer.

Moreover, the preceding example shows that a benefit is reached, in term of density of through holes, because the RTA operation (or more generally speaking an operation allowing to reduce the depth of the shallow holes) is performed on a thin layer which does not present through holes (or at least which presents through holes in a density lower than a maximum density). Furthermore, through holes density before said operation is controlled thanks to an implantation step adequately performed, notably by increasing the thickness of the layer being transferred onto the support substrate.

Figure 10A:
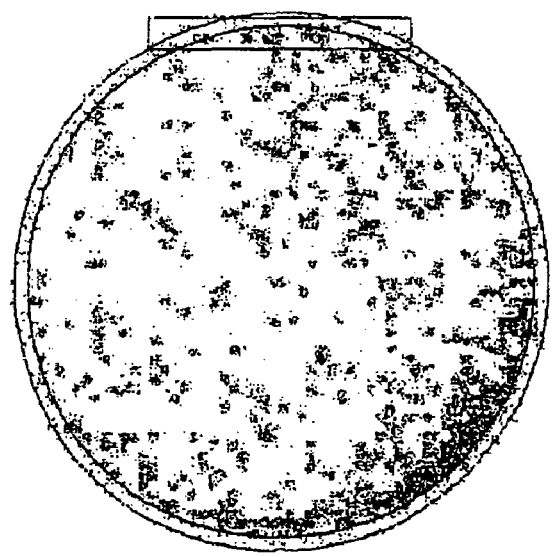
FIGS. 10a and 10b illustrate the effect of an embodiment of the inventive method on reducing the density of killing holes.
Figure 10B:
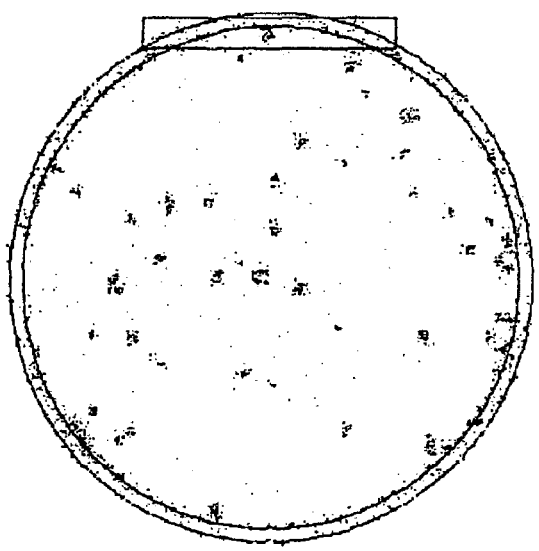

FIG. 10 shows that an increase of 450 angstroms of the transferred layer, when combined with a finishing RTA-SOx-RTA-SOx sequence of operations, allows to decrease the density of through holes by a factor 5 in the final thin layer (thickness 200 angstroms). Indeed the left hand side diagram drawn for a classically obtained SOI structure reveals a through holes density of 0.5 holes/$cm^2$, while the right hand side diagram drawn for an SOI structure obtained as mentioned hereabove, reveals a through holes density of 0.1 holes/$cm^2$ only.

Figure 11:
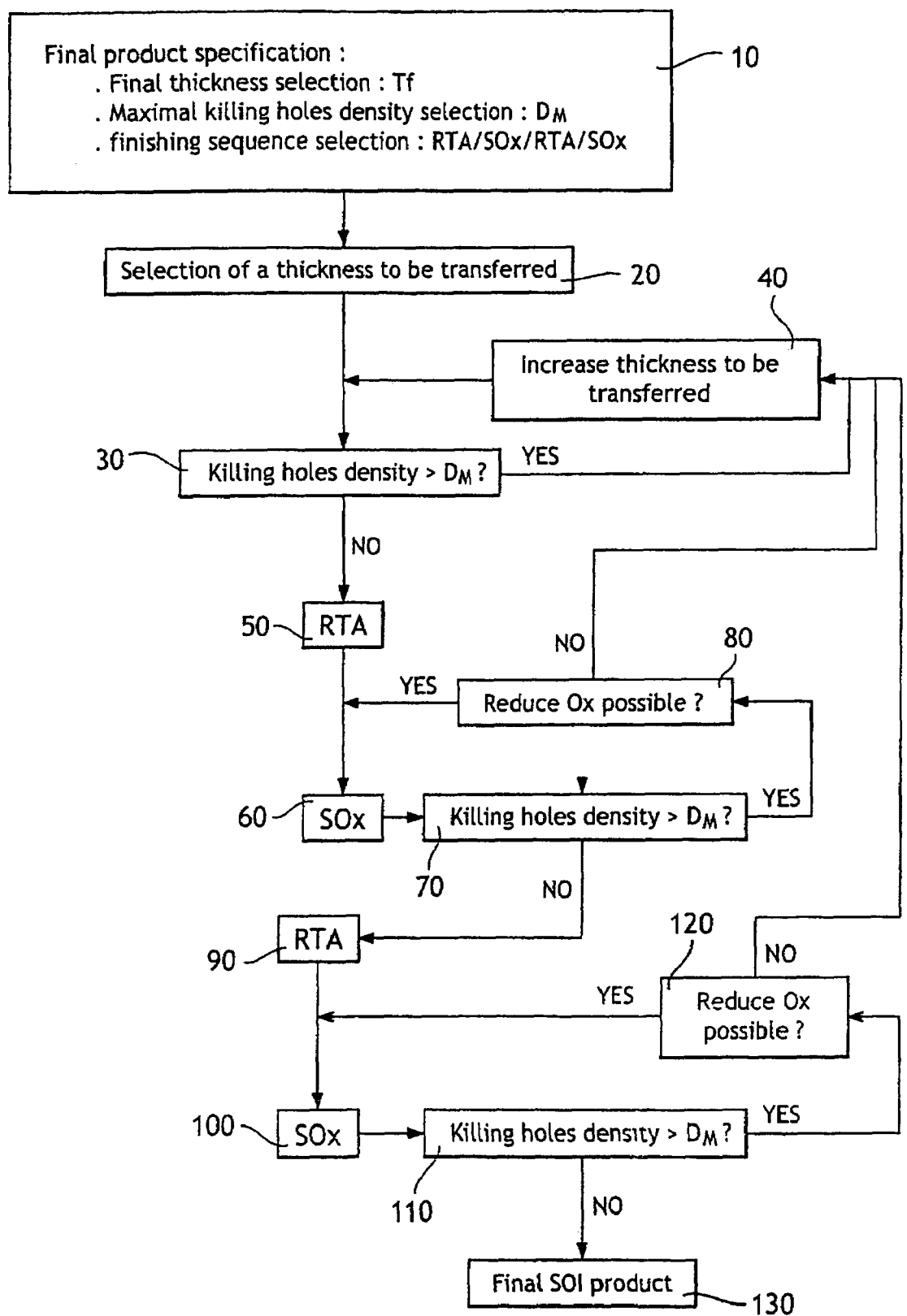
FIG. 11 is a flow chart illustrating an embodiment of an innovative method.

FIG. 11 is a flow chart illustrating a method according to a possible embodiment of the invention for determining a manufacturing process for making an SOI device. At block 110, the specifications of the final SOI product are detailed, in particular by selecting:

the thickness Tf of the thin layer of the final structure,
the finishing sequence of operation(s) of the intermediate structure obtained after transfer (in this case an RTA-SOx-RTA-SOX sequence),
and the maximum density of through holes $D_M$ within the thin layer of the final structure.

At block 120, a thickness to be transferred is selected. At block 130, it is checked whether the density of through holes within the part of the donor substrate which has been transferred onto the support substrate is higher than the selected maximum density $D_M$ or not.

If yes, the thickness to be transferred is increased (block 140) and block 130 is thereafter repeated. If no, the first operation of the finishing sequence is performed. In this case, at block 150, an RTA operation is performed. As already stated hereabove, such an RTA operation has no effect on through holes, but helps reducing the depth of the shallow holes.

At block 160, the second operation of the finishing sequence, an SOx operation, is performed. As stated above, such an SOx operation is effective for thinning the transferred thin layer, but increases the through holes density according to the thickness consumption.

At block 170, following the SOX operation, and similarly to block 130, it is checked whether the density of through holes within the part of the donor substrate which has been transferred onto the support substrate is higher than the selected maximum density $D_M$ or not.

If yes, at block 180, it is checked whether it is possible to decrease the thickness consumption of the SOx operation (performed at block 160). This is done by taking into account the selected particular finishing sequence, and the selected final thickness Tf. If the thickness consumption can be decreased, the SOx operation is performed (block 160) according to this newly set operative conditions. If the thickness consumption cannot be decreased, then block 140 is performed (that is increase of the transferred thickness).

Coming back to block 170, if the density of killing holes after the SOx operation is lower than the maximum density $D_M$, the next operation of the finishing sequence (here an RTA operation which does not consume thickness and does not modify the killing holes density) is performed at block 190.

A SOx operation is thereafter performed at block 200. At blocks 210 and 220 operations are performed which are similar to those performed respectively at blocks 170 and 180. Following the SOx operation, and provided that (block 210) the through holes density is lower than the maximum density $D_M$, the final SOI product conforms to the specifications (defined at block 110) is obtained at block 230.

It will be understood that the flowchart of FIG. 11 is purely illustrative and that the present invention is by no means limited to the embodiments described and represented, but the man skilled in the art will be able to bring many alternatives or modifications there.

While illustrative embodiments of the invention are disclosed herein, it will be appreciated that numerous modifications and other embodiments can be devised by those of ordinary skill in the art. In one embodiment, a maximum thickness for the transferred semiconductor layer to obtain the desired results is also determined. Features of the embodiments described herein can be combined, separated, interchanged, and/or rearranged to generate other embodiments. Therefore, it will be understood that the appended claims are intended to cover all such modifications and embodiments that come within the spirit and scope of the present invention.

What is claimed is:

1. A method for configuring a process for treating a semiconductor wafer, the method comprising:

selecting a target thickness to be obtained for a processed semiconductor layer of the semiconductor wafer, which semiconductor layer is to be transferred from a donor substrate;

selecting a target maximum density of through holes to extend completely through the processed semiconductor layer;

selecting a finishing sequence of operations to be conducted on the semiconductor layer after transfer thereof in order to improve surface quality of the transferred semiconductor layer to provide the processed semiconductor layer wherein the selected finishing sequence includes at least one shallow-hole reducing operation that reduces depth of shallow holes that are present in the transferred layer, which shallow holes extend less than completely through the transferred layer; and determining a minimum layer thickness of the transferred layer to be provided by:

providing the donor substrate that comprises the semiconductor layer and a region of weakness that is configured to facilitate detachment of the semiconductor layer from a remainder portion of the donor substrate, which semiconductor layer and remainder portion are disposed on opposite sides of the region of weakness, associating semiconductor layer with a support substrate, and detaching the semiconductor layer at the region of weakness from the remainder portion to transfer the semiconductor layer to the support substrate to provide the semiconductor wafer, such that the transferred semiconductor layer has at least said minimum layer thickness;

wherein said minimum thickness is determined such that the density of through holes is below said target maximum density after each operation in the finishing sequence, and such that the target thickness is achieved when the finishing sequence is complete.

2. The method of claim 1, wherein the region of weakness, of the donor substrate that includes the semiconductor layer for which the minimum layer thickness is determined, is provided by implanting atomic species into the donor substrate.

3. The method of claim 2, further comprising selecting an implantation energy between about 15 keV and about 120 keV for implanting the atomic species.

4. The method of claim 3, wherein the selected implantation energy is less than about 80 keV.

5. The method of claim 1, wherein the at least one shallow-hole reducing operation comprises a thermal annealing operation.

6. The method of claim 1, wherein the at least one shallow-hole reducing operation comprises a polishing operation.

7. The method of claim 1, wherein the selected finishing sequence comprises at least one succession of a rapid thermal annealing operation and a sacrificial oxidation operation.

8. The method of claim 7, wherein the rapid thermal annealing operation precedes the sacrificial oxidation operation in said succession.

9. The method of claim 1, wherein the selected finishing sequence comprises at least one succession of operations comprising a first sacrificial oxidation operation, followed by a polishing operation, followed by a second sacrificial oxidation operation.

10. The method of claim 1, wherein the selected finishing sequence comprises at least one succession of operation comprising a first sacrificial oxidation operation, followed by a rapid thermal annealing operation, followed by a polishing operation, followed by a second sacrificial oxidation operation.

11. The method of claim 1, wherein the minimum layer thickness is determined for the transferred layer, which is associated with the support substrate with an insulating layer disposed between the transferred layer and the support substrate to provide a semiconductor-on-insulator wafer.

12. The method of claim 11, wherein the transferred layer is made of silicon, and the insulator layer is made of an oxide, to provide a silicon-on-insulator wafer after the detachment.

13. The method of claim 11, wherein the selected finishing sequence comprises at least two sequential successions of operations, each succession comprising a rapid thermal annealing operation followed by a sacrificial oxidation operation, wherein the target maximum density of through holes about $0.1/cm^2$.

14. The method of claim 1, further comprising determining a depth in the donor substrate at which the region of weakness is to be provided to obtain the transferred layer having at least said determined minimum thickness.

15. The method of claim 1, further comprising:
providing the semiconductor wafer with the transferred layer of at least said determined minimum thickness and having a surface quality; and
conducting the selected finishing sequence of operations to obtain the processed layer, which has:
the improved surface quality compared to the surface quality of the transferred layer,
substantially the target thickness, and
substantially the target maximum density of through holes.

16. The method of claim 15, wherein the region of weakness is provided at a depth in the donor substrate that is substantially equal to or greater than the determined minimum thickness.

17. A method for configuring a process for treating a semiconductor wafer, the method comprising determining a minimum layer thickness of a transferred layer associated with a support substrate and having a transferred surface quality to obtain a processed layer that has a preselected target thickness and a target maximum density of through holes that extend completely therethrough by conducting a predetermined finishing sequence of operations to improve the surface quality of the processed layer compared to the transferred surface quality, wherein said minimum thickness is determined such that the density of through holes is below said target maximum density after each operation in the finishing sequence, wherein the semiconductor wafer is a semiconductor-on-insulator wafer; the finishing sequence includes at least one shallow hole reducing operation that reduces depth of shallow holes that are present in the transferred layer, which shallow holes extend less than completely through the transferred layer, and with the method further comprising:
providing a donor substrate that comprises the semiconductor layer with a region of weakness that is configured to facilitate detachment of the layer to be transferred from a remainder portion of the donor substrate, which transfer layer and remainder portion are disposed on opposite sides of the region of weakness,
associating the transfer layer with a support substrate, and
detaching the transfer layer at the region of weakness from the remainder portion to transfer it to the support substrate to provide the processed layer having the preselected target thickness and a target maximum density of through holes semiconductor wafer.

18. A method for configuring a process for treating a semiconductor wafer to reduce the number of through holes in a transferred layer, the method comprising:
providing a donor substrate of a semiconductor material a layer of which is to be transferred to a support substrate;
determining a thickness of the layer to be transferred wherein the thickness is sufficient to allow a finishing sequence of operations to be conducted while also providing a target maximum density of through holes that extend completely through the layer;
transferring the layer to the support substrate by:
providing the donor substrate with a region of weakness that is configured to facilitate detachment of the semiconductor layer from a remainder portion of the donor substrate, which semiconductor layer and remainder portion are disposed on opposite sides of the region of weakness,
associating semiconductor layer with the support substrate, and
detaching the semiconductor layer at the region of weakness from the remainder portion to transfer the semiconductor layer to the support substrate to provide the semiconductor wafer, such that the transferred semiconductor layer has at least the minimum layer thickness; and
applying a finishing sequence of operations on the layer after transfer to improve surface quality and to provide a processed semiconductor layer that has a density of through holes that is below the target maximum density after each operation in the finishing sequence;
wherein the finishing operation includes at least one shallow-hole reducing operation that reduces depth of shallow holes that are present in the transferred layer, which shallow holes extend less than completely through the transferred layer; and
wherein the target thickness is achieved when the finishing sequence is complete.

* * * * *